(12) United States Patent
Cummings

(10) Patent No.: US 10,285,094 B2
(45) Date of Patent: May 7, 2019

(54) MOBILE BASE STATION NETWORK

(71) Applicant: Mark Cummings, Atherton, CA (US)

(72) Inventor: Mark Cummings, Atherton, CA (US)

( * ) Notice: Subject to any disclaimer, the term of this patent is extended or adjusted under 35 U.S.C. 154(b) by 64 days.

(21) Appl. No.: 15/492,541

(22) Filed: Apr. 20, 2017

(65) Prior Publication Data

US 2017/0251404 A1 Aug. 31, 2017

Related U.S. Application Data

(63) Continuation-in-part of application No. 15/060,478, filed on Mar. 3, 2016, which is a continuation of (Continued)

(51) Int. Cl.
| | |
|---|---|
| *H04W 8/22* | (2009.01) |
| *H04W 28/18* | (2009.01) |
| *H04W 48/16* | (2009.01) |
| *H04W 16/18* | (2009.01) |
| *H04L 29/08* | (2006.01) |
| *G06F 9/4401* | (2018.01) |
| *G06F 17/50* | (2006.01) |
| *H04W 24/02* | (2009.01) |
| *H04W 88/18* | (2009.01) |
| *H04W 16/14* | (2009.01) |
| *H04W 28/02* | (2009.01) |
| *H04W 84/00* | (2009.01) |

(52) U.S. Cl.
CPC .......... *H04W 28/18* (2013.01); *G06F 9/4411* (2013.01); *G06F 17/505* (2013.01); *H04L 67/16* (2013.01); *H04W 8/22* (2013.01); *H04W 16/18* (2013.01); *H04W 24/02* (2013.01); *H04W 48/16* (2013.01); *H04W 16/14* (2013.01); *H04W 28/0221* (2013.01); *H04W 84/005* (2013.01); *H04W 88/18* (2013.01)

(58) Field of Classification Search
None
See application file for complete search history.

(56) References Cited

U.S. PATENT DOCUMENTS 5,555,286 A * 9/1996 Tendler ............. H04M 1/72519
455/404.2
5,751,909 A 5/1998 Gower
(Continued)

FOREIGN PATENT DOCUMENTS

| CN | 1762130 | 4/2006 |
| CN | 101013957 | 8/2007 |
| CN | 101616007 | 12/2009 |

OTHER PUBLICATIONS

Accellera, Unified Power Format (UPF) Standard. Version 1.0. Feb. 22, 2007.
(Continued)

*Primary Examiner* — Brian S Roberts
(74) *Attorney, Agent, or Firm* — Van Pelt, Yi & James LLP

(57) ABSTRACT

Mobile base station information is exchanged with an other base station. One or more parameters are exchanged with the other base station based on the base station information. A mobile base station is configured based at least in part on the negotiated one or more parameters. The configured mobile base station is used to provide cellular coverage to one or more user devices.

20 Claims, 11 Drawing Sheets

Related U.S. Application Data application No. 13/290,736, filed on Nov. 7, 2011, now Pat. No. 9,311,108.

(60) Provisional application No. 62/326,474, filed on Apr. 22, 2016, provisional application No. 61/456,385, filed on Nov. 5, 2010.

(56) References Cited

U.S. PATENT DOCUMENTS

| | | | |
|---|---|---|---|
| 5,966,531 | A | 10/1999 | Skeen |
| 5,970,490 | A | 10/1999 | Morgenstern |
| 6,438,594 | B1 | 8/2002 | Bowman-Amuah |
| 6,618,805 | B1 | 9/2003 | Kampe |
| 6,711,624 | B1 | 3/2004 | Narurkar |
| 6,976,160 | B1 | 12/2005 | Yin |
| 7,263,551 | B2 | 8/2007 | Belfiore |
| 8,291,468 | B1 | 10/2012 | Chickering |
| 8,775,218 | B2 | 7/2014 | Burgoon, Jr. |
| 9,317,843 | B2 | 4/2016 | Bradley |
| 2003/0074443 | A1 | 4/2003 | Melaku |
| 2004/0111590 | A1 | 6/2004 | Klein |
| 2004/0203385 | A1 | 10/2004 | Narayanan |
| 2004/0267965 | A1 | 12/2004 | Vasudevan |
| 2005/0055196 | A1 | 3/2005 | Cohen |
| 2005/0096055 | A1* | 5/2005 | Colban ............... H04L 12/189 455/442 |
| 2005/0157660 | A1 | 7/2005 | Mandato |
| 2005/0203892 | A1 | 9/2005 | Wesley |
| 2005/0251501 | A1 | 11/2005 | Phillips |
| 2006/0007919 | A1* | 1/2006 | Steinheider ........... H04W 92/12 370/352 |
| 2006/0190904 | A1 | 8/2006 | Haji-Aghajani |
| 2007/0055552 | A1 | 3/2007 | St Clair |
| 2007/0130208 | A1 | 6/2007 | Bornhoevd |
| 2007/0283317 | A1 | 12/2007 | Sadler |
| 2008/0046292 | A1 | 2/2008 | Myers |
| 2008/0062871 | A1 | 3/2008 | Grayson |
| 2008/0068989 | A1 | 3/2008 | Wyk |
| 2009/0070728 | A1 | 3/2009 | Solomon |
| 2009/0080408 | A1 | 3/2009 | Natoli |
| 2009/0100178 | A1 | 4/2009 | Gonzales |
| 2010/0014533 | A1 | 1/2010 | Hirano |
| 2010/0063930 | A1 | 3/2010 | Kenedy |
| 2010/0125664 | A1 | 5/2010 | Hadar |
| 2010/0191765 | A1 | 7/2010 | Gan |
| 2010/0192120 | A1 | 7/2010 | Raleigh |
| 2010/0202391 | A1 | 8/2010 | Palanki |
| 2011/0007708 | A1* | 1/2011 | Hapsari ............... H04W 36/24 370/331 |
| 2011/0016214 | A1 | 1/2011 | Jackson |
| 2011/0116480 | A1 | 5/2011 | Li |
| 2011/0137805 | A1 | 6/2011 | Brookbanks |
| 2011/0138060 | A1 | 6/2011 | Purkayastha |
| 2011/0145153 | A1 | 6/2011 | Dawson |
| 2011/0145209 | A1 | 6/2011 | Kahn |
| 2011/0153854 | A1 | 6/2011 | Chickering |
| 2011/0182253 | A1* | 7/2011 | Shekalim ............ H04W 28/18 370/329 |
| 2011/0246236 | A1 | 10/2011 | Green, III |
| 2011/0250911 | A1* | 10/2011 | Xu ..................... H04J 11/003 455/501 |
| 2011/0276713 | A1 | 11/2011 | Brand |
| 2012/0033621 | A1* | 2/2012 | Mueck ............ H04W 72/0453 370/329 |
| 2012/0096525 | A1 | 4/2012 | Bolgert |
| 2012/0116782 | A1 | 5/2012 | Punnoose |
| 2012/0239685 | A1 | 9/2012 | Kahn |
| 2013/0237182 | A1 | 9/2013 | Schlager |
| 2016/0081055 | A1 | 3/2016 | Chika |
| 2016/0259902 | A1 | 9/2016 | Feldman |
| 2017/0012870 | A1 | 1/2017 | Blair |
| 2017/0103215 | A1 | 4/2017 | Mahaffey |
| 2017/0147722 | A1 | 5/2017 | Greenwood |

OTHER PUBLICATIONS

Amba Design Kit. Revision: r3p0. Technical Reference Manual. ARM DDI 0243C. Copyright (c) 2003, 2007.

Amba Designer ADR-400. Revision: r3p1. User Guide ARM DUI 0333K. Copyright (c) 2006-2010, 2011 ARM.

Anupam Bakshi, IDesignSpec (TM) Don't Fear Change, Embrace it. Agnisys Inc. May 1, 2008.

Author Unknown, IEEE Standard for IP-XACT, Standard Structure for Packaging, Integrating, and Reusing IP within Tool Flows. IEEE Computer Society and the IEE Standards Association Corporate Advisory Group. Sponsored by the Design Automation Standards Committee. Feb. 18, 2010.

Author Unknown, SDR Conference 2009. V1 4.

Author Unknown, Software Defined Radio Forum. SDR Forum. Use Cases for MLM Language in Modem Wireless Networks. SDRF-08-P-0009-V1.0.0. Jan. 28, 2009.

Author Unknown, SystemRDL V1.0: A Specification for a Register Description Language. Prepared by the Register Description Working Group of the SPIRIT Consortium. Mar. 24, 2009.

Author Unknown, VMM Register Abstraction Layer User Guide. Jul. 2011.

Cooklev et al., Networking Description Language for Ubiquitous Cognitive Networking. SDR Technical Conference, Washington, DC, Oct. 2008.

Cummings et al., Via Commercial Wireless Metalanguage Scenario. SDR Technical Conference. 2007.

Cummings et al. IEEE 802.21: The Leading Edge of a Larger Challenge. 2008.

Cummings et al., ECSG Adhoc Use Case Tutorial. IEEE 802 Executive Committee Study Group on TV White Spaces—Adhoc Use Case Sub-Group. Jan. 20, 2009.

Cummings et al., en Via. The Role of a Metalanguage in the Context of Cognitive Radio Lifecycle Support. SDR Technical Conference. Orlando, Nov. 16, 2006.

Cummings et al., Activities of SDR Forum MLM Working Group on a Language for Advanced Communication Systems Applications. SDR Technical Conference, Washington, DC, Oct. 2008.

Cummings et al., Changing Metalanguage Landscape. IPFW Indiana University—Purdue University Fort Wayne. SDR Conference 2009.

Cummings et al., Changing Metalanguage Landscape. Proceedings of the SDR '09 Technical Conference and Product Exposition, Copyright (c) 2009 SDR Form, Inc.

Cummings et al., Commercial Wireless Metalanguage Scenario. SDR Technical Conference. v13. 2007.

Cummings et al., en Via II. Perspectives on a Meta Language for Configurable Wireless Systems. SDR Forum Technical Conference Phoenix, Nov. 2004.

Cummings et al., en Via. Commercial Wireless Metalanguage Scenario. SDR Technical Conference, Denver, CO. Nov. 2007.

Cummings et al., The Role of a Metalanguage in the Context of Cognitive Radio Lifecycle Support. SDR Technical Conference. 2006.

Dave Murray, duolog technologies. Using IP-XPACT (TM) in Complex SoC i/o Integration and SoC Register Management. IP-XACT Users Group: Session 1 (in association with Texas Instruments). Jul. 8, 2008.

Fette et al., Next-Generation Design Issued in Communications. Portable Design. Mar. 2008.

G.V. Tsoulos et al., Research Gate, Dynamic Wireless Network Shaping via Moving Cells: The Nomadic Nodes Case, Jan. 2017.

Google, Inc., Authorized Ex Parte Contract—Unlicensed Operation in the TV Broadcast Bands (ET Docket No. 04-186). Apr. 10, 2009.

Hwang et al., A Moving Cell Bearer Management Architecture for LTE-Advanced System, Wireless Transmission Research Section, Electronics and Telecommunications Research Institute, Korea, Jul. 1-3, 2015.

Kokar et al., Towards a Unified Policy Language for Future Communication Networks: A Process. DYSPAN Conference, Chicago Oct. 2008.

Kokar et al., Towards a Unified Policy Language for Future Communication Networks: A Process. DySpan. NDL v10. 2008.

(56) References Cited

OTHER PUBLICATIONS

Lawton, G. New Protocol Improves Interaction among Networked Devices and Applications. Computing Now [online], Jul. 2010 [retrieved on Feb. 23, 2012]. Retrieved from the Internet: <URL: http//www.computer.org/portal/web/computingnow/archive/news065>.

Mark Cummings, Creating a New Wireless World. EE Times. Aug. 23, 2004.

Mark Cummings, Commercial SDR Drivers & Status SDR Forum Technical Plenary. RFco Semiconductor. Toronto. Jun. 15, 2004.

Mark Cummings, en Via II. Managing Complexity as Networks Evolve. Future Wireless Workshop. SDR Form. Seoul, South Korea. Sep. 13, 2004.

Mark Cummings, en Via II. SDR Forum: Commercial SDR Initiative. GSPx, Sep. 30, 2004.

Mark Cummings, IEEE P802.19 Wireless Coexistence. Directions to a TV White Space Coexistence Mechanisms Par. Aug. 17, 2009.

Mark Cummings, Status and Future Directions of Technology for Software Defined Radios and Implications for Regulators. Symposium on Download Security and Regulatory Issues. RFco. Tokyo. Apr. 14, 2003.

Mark Cummings, System of Systems Joint E2R / SDR Forum Workshop. RFco Semiconductor. Mainz. Apr. 20, 2004.

Mark Cummings, Vision, Trend and Challenges of SDR. RFco. ITU Workshop. Geneva. Dec. 3, 2003.

Mark Cummings. Alternatives for Coexistence Mechanisms in White Space. doc.: IEEE 802.19-09/0044r0. Jul. 7, 2009.

Matthew Sherman. TV Whitespace Tutorial Intro. IEEE 802 Executive Committee Study Group on TV White Spaces. Mar. 10, 2009.

Paine et al., IEEE P802.19. Wireless Coexistence. WhiteSpace Coexistence Ue Cases. Jul. 2009.

Patrick Mannion, Cognitive Radio Hailed as Next Big Thing: in Wireless. EE Times. Aug. 23, 2004.

Subrahmanyam et al., Perspectives on a Metalanguage for Configurable Wireless Systems. SDR Technical Conference. 2004.

Synopsys, Inc., An Introduction to the VMM Register Abstraction Layer. SOCentral. Jul. 30, 2007.

Visarius et al. 'Generic Integration infrastructure for IP-based design processes and tools with a unified XML format. Integration, the VLSI Journal-Special issue: IP and design reuse', vol. 37, Issue 4. Published Sep. 2004 [online] Retrieved from the Internet <URL: http://www.sciencedirect.com/science/article/pii/S016792600400033>.

Wagner et al., 'Strategies for the integration of hardware and software IP components in embedded systems-on-chip'. In Integration, the VLSI Journal, vol. 37. Published Sep. 2004 [online] Retrieved from the Internet <URL http://www.sciencedirect.com/science/article/pii/S0167926003001093>.

Wirthlin et al. Future Field Programmable Gate Array (FPGA) Design Methodologies and Tool Flows. Report AFRL-RY-WP-TR-2008-1228 of the Air Force Research Laboratory [online]. Published Jul. 2008. [retrieved on Mar. 8, 2012] Retrieved from the Internet <URL: http://www.dtic.mil/cgi-bin/GetTRDoc?AD=ADA492273&Location=U2&doc=GetTRDoc.pdf>.

Wirthlin et al. 'OpenFPGA CoreLib core library interoperability effort'. In Journal of Parallel Computing, vol. 34, issue 4-5 [online]. Published May 2008. [retrieved on Mar. 8, 2012] Retrieved from the Internet <URL:http://ce-serv.et.tudelft.nl/publicationfiles/1605_1002_OpenFPGA.pdf>.

Trusted Computing Group, TCG Trusted Network Connect, TNC IF-MAP Binding for SOAP, Specification Version 1.1, Revision 5, May 18, 2009.

\* cited by examiner

MOBILE BASE STATION NETWORK

CROSS REFERENCE TO OTHER APPLICATIONS

This application claims priority to U.S. Provisional Patent Application No. 62/326,474 entitled MOBILE BASE STATION NETWORK filed Apr. 22, 2016 which is incorporated herein by reference for all purposes.

This application is a continuation in part of co-pending U.S. patent application Ser. No. 15/060,478, entitled ORCHESTRATING WIRELESS NETWORK OPERATIONS, filed Mar. 3, 2016, which is a continuation of U.S. patent application Ser. No. 13/290,736, now U.S. Pat. No. 9,311,108, entitled ORCHESTRATING WIRELESS NETWORK OPERATIONS, filed on Nov. 7, 2011, which claims priority to U.S. Provisional Patent Application No. 61/456,385, entitled COLLABORATIVE COMMUNICATIONS AND COMPUTING, filed Nov. 5, 2010, all of which are incorporated herein by reference for all purposes.

BACKGROUND OF THE INVENTION

Mobile telecommunication systems enable users of mobile devices to connect via a mobile telecommunications network. The mobile devices can communicate and/or connect to computers or other devices accessible via the mobile telecommunications network.

Conventionally, mobile telecommunications networks have been provided using a mobile telecommunications network infrastructure comprising a plurality of fixed macro base stations. An example of a fixed macro base station is a cell tower or one or more antennas mounted on buildings or other structures. Such macro base stations have been used to provide a network of fixed access nodes, each of which provides coverage for a corresponding fixed coverage area. As a mobile device moves between coverage areas, the mobile telecommunications network coordinates a "hand off" of a call or other communication session from one macro base station to another macro base station.

In some situations, a fixed macro base station is incapable of providing sufficient coverage to user devices located within the coverage area of the macro base station. For example, upon completion of a sporting event, thousands of people with user devices may leave a stadium at the same time, each of which is attempting to use his or her user device for various reasons (e.g., checking email, making a call, posting a picture on social media, hailing a ridesharing service, etc.). The increased demand for coverage may result in many people being unable to use their user devices.

In the past, cellular operators have used mobile base stations for large events where an increase in load is anticipated, such as the Super Bowl, to assist a macro base station in providing coverage. However, such mobile base stations are very similar to conventional macro base stations. These mobile base stations typically use a large truck to house macro base station type radio equipment and a boom on the roof of the truck to carry the macro base station style antenna system and point-to-point microwave antenna for backhaul (connection to the network infrastructure).

Such mobile base stations are impractical for more general use with conventional infrastructure because they also take hours to manually set up and days, weeks, and sometimes months, to do the network planning and infrastructure configuration to make them work. They generally use gasoline powered generators and special microwave back haul. To operate these kinds of mobile base stations is expensive and in some cases requires special limited time permits from local governments. Thus, it is not practical to use this type of mobile base station, except for these special situations. Even then, a more cost effective solution would be preferred.

Another technique used to provide cell coverage is the use of small base stations. Small base stations generally have small antenna(s), are contained in small enclosures, use less power than macro base stations, have smaller capacities (numbers of channels, etc.), and have smaller coverage areas. They are generally used in indoor areas that are difficult for macro base stations to cover such as airports, coffee shops, etc. Being indoors, they have limited interaction with the macro base stations and are thus easier to configure and operate. To cover the same area with small base stations, many more installations are required than to cover it with macro base stations. When the full cost of rent, power, service, vandalism, and operations is considered, small base stations are very expensive. So expensive, that when the added complexity is factored in, macro base stations are still preferred.

One way to reduce the complexity is to use separate blocks of radio spectrum for the small cells and the macro cells. Although, this reduces complexity it reduces the efficiency of spectrum utilization. And spectrum turns out to be the most valuable resource. So, again on a cost basis, the fixed macro base station is preferred.

Some have begun to provide coverage to mobile communications devices in vehicles. This is done by using two different types of wireless. The vehicle is served by a cellular service (2G, 3G, 4G, special maritime communication satellite system, special aircraft satellite communication system, etc.). This cellular service is connected inside the vehicle to a low power/complexity/quality of service type wireless system such as WiFi, Blue Tooth, etc. These services do not interfere with the cellular infrastructure and reduce the complexity challenge. Thus, they provide some extension of communication but a limited forma and primarily to those within the vehicle.

In Japan, at extremely crowded pedestrian outdoor events, some have started using special backpack mounted small base stations. These small base stations are battery powered and have relatively small antennas, low to the ground and shaded by the crowd of people. This results in limited interaction with the macro base stations in the area, potentially reducing complexity. The pedestrian mounted base station cannot move very quickly, especially in the crowded environment. This makes the interaction with macro base stations very predictable, further reducing complexity and allowing for pre planning in a similar fashion to that of the mobile macro base stations described above. Even so, some are using separate radio spectrum to further reduce complexity. Thus, the backpack base station employed is not practical to use, except for very special situations.

There are systems that use satellite mounted base stations to serve user devices. These, by their very nature, follow extremely exact routes with extremely exact timing. It is possible to pre-plan how the array (constellation) of satellites will cooperate to create a coverage pattern (cell topology). The coverage pattern changes over time, but in a very precisely predictable pattern. Thus the changing coverage pattern is extremely predictable. The predictability reduces complexity and allows a normal cellular operational system to be applied on top of it.

The military has developed mesh based mobile networks to use on the battlefield. These have traded off RF spectrum efficiency and quality of service to achieve their mobility. Attempts to commercialize these systems with their associ-

BRIEF DESCRIPTION OF THE DRAWINGS

Various embodiments of the invention are disclosed in the following detailed description and the accompanying drawings.

DETAILED DESCRIPTION

Figure 1A:
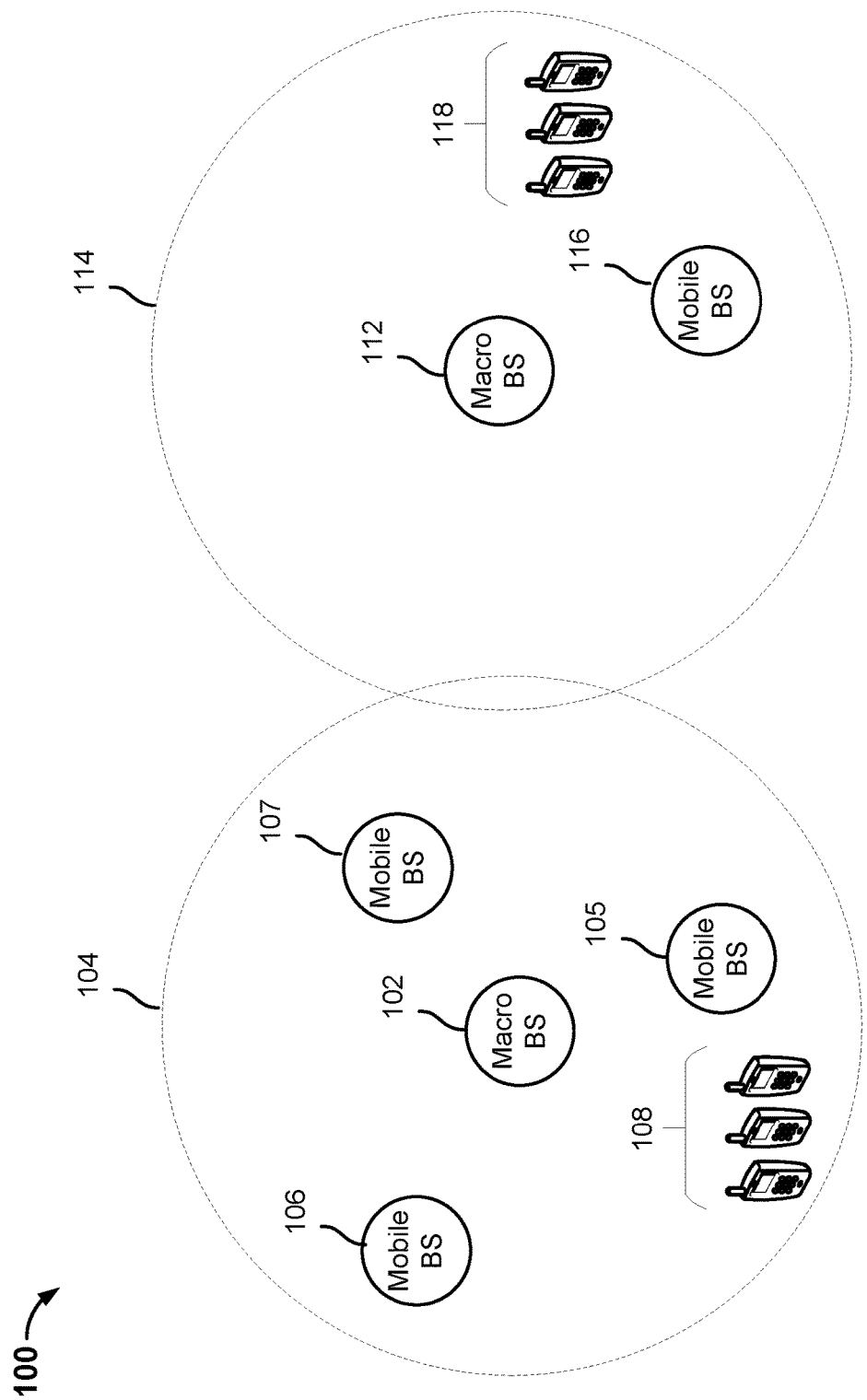
FIG. 1A is a block diagram illustrating an embodiment of a system for providing mobile telecommunications.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A mobile telecommunications network comprising a plurality of mobile base stations is disclosed. A mobile base station can be attached to or located within, a vehicle (e.g., a car, truck, bus, train, etc.) an aircraft (e.g., drone, balloon, airplane, etc.), a boat, and/or any other transportation means. This reduces the costs associated with real estate, antenna towers, etc. The mobile base station can be used to provide nearby user devices (e.g., passengers with cell phones located inside a vehicle, users with cell phones located within a threshold distance (e.g., the cell size or coverage area of the small cell of the mobile base station)) with cellular coverage for a mobile telecommunications network. In some embodiments, the mobile base station can be quickly added (e.g., seconds or less) to a macro base station coverage area through a process of discover, connection, exchange, negotiation, configuration, and initiation. In other embodiments, the mobile base station can self-organize with other mobile base stations to create a mobile telecommunications network though the process of discover, connection, exchange, negotiation, configuration, and initiation.

Cellular communication systems depend on frequency and channel reuse to function. To achieve this reuse, many different parameters need to be coordinated between base stations. These parameters include transmit frequencies, receive frequencies, time slots, orthogonal frequency-domain multiplexing (OFDM) sub carriers, transmit power, antenna characteristics, pilots, assignment of user equipment (UE) to particular base stations, and/or handover of user sessions from one base station to another (e.g., a user moves from one coverage area to another). Adding a base station to an existing neighborhood of base stations requires not only configuring all the relevant parameters of a new base station, but also reconfiguring the parameters of existing base stations.

Installing a mobile base station within or on a vehicle allows the distribution of service availability to closely match the geographic distribution of demands for a service. As the demand for cellular service in a particular area increases, the use of mobile base stations allows a telecommunications network to adequately respond and adjust for the increase in demand. Thus capacity can "breath" during the day, week, month, etc. as activity patterns affect demand for service, as well as grow and shrink as fundamentals affecting demand for service change in a geographic area.

FIG. 1A is a block diagram illustrating an embodiment of a system for providing mobile telecommunications. In the example shown, system 100 includes a macro base station 102 with coverage area 104 and a macro base station 112 with coverage area 114. Mobile base stations 105, 106, 107 and user devices 108 are located within coverage area 104. Mobile base station 116 and user devices 118 are located within coverage area 114.

Macro base stations 102, 112 can be a cell tower or other type of base station attached to a physical structure (e.g., building) on which a physical or logical array of antennas are mounted. Macro base station 102 is configured to report to macro base station 112 the signal strength received from macro base station 112. Macro base station 112 is configured to report to macro base station 102 the signal strength received from macro base station 102. Macro base station 102 can adjust a transmit power based on the reported signal strength to ensure its transmit signal does not interfere with the transmit signal of macro base station 112. Macro base station 112 can also adjust a transmit power based on the reported signal strength to ensure its transmit signal does not interfere with the transmit signal of macro base station 102.

Macro base stations 102, 112 can be associated with corresponding orchestrators (not shown). In some embodiments, the orchestrator is part of the macro base station. In other embodiments, the orchestrator is connected to the macro base station. An orchestrator includes a data store that stores image data associated with macro base stations 102, 112 and other macro base stations of the mobile telecommunications network. The data store can be an Interface for Metadata Access Points (IF-MAP) data store. IF-MAP provides the ability of IF-MAP clients, such as the corresponding orchestrators of macro base stations 102, 112, to store and update metadata records, as well as to subscribe to be updated in the event of changes in image data associated with a macro base station (e.g., a macro base station is reconfigured, a capability associated with the macro base station is upgraded/degraded, a change occurs in the environment) or image data associated with a mobile base station. The data store can include a neighbor list of nearby macro base stations and mobile base stations. The data store can be updated in real-time without having to be shut down for maintenance.

Mobile base stations 105, 106, 107, 116 can provide cell coverage to one or more user devices located within its coverage area. For example, mobile base station 105 can provide cell coverage to user devices 108 and mobile base station 116 can provide cell coverage to user devices 118.

A mobile base station can include a plurality of antennas and a power source (on a scale that is bigger than a handset) that allows it to transmit at higher power than a typical mobile device (e.g., handset). A mobile base station can be assigned by a macro base station a block of radio resource (e.g., frequency channel) to use for transmit and receive functionality. The mobile base station can be configured to use a small portion of the radio resource for backhaul and use the rest of the radio resource to serve a plurality of user devices (i.e., front haul). In the past, a macro base station could assign the same block of radio resource to a single mobile device. In contrast, assigning the block of radio resource to a mobile base station allows a plurality of user devices (e.g., 30 user devices) to be served using the same block of radio resource, thus increasing capacity in that neighborhood.

In some embodiments, the mobile base station is installed within a vehicle and includes one or more physical security components. With the emergence of ride sharing services, there may be instances where either the driver or passenger face a personal security challenge. Security challenges also exist in other public transportation modalities, such as taxis buses, trains, etc. Including one or more physical security components can help to address the security challenges. For example, the mobile base station can include a security camera, one or more microphones, and/or one or more physical security buttons that when triggered (i.e., panic button), notify personnel at a remote location of a problem occurring within the vehicle. In other embodiments, the mobile base station can provide enhanced information security. Information security enhancements are possible because the Orchestrator, the mobile base station, the installation around the mobile base station, and/or one or more passwords known by the vehicle operator, contain special security resources that can in conjunction with the user devices, add extra layers of security protection. For example, a mobile base station can have a corresponding encryption key that is used to encrypt the network traffic associated with a user device. In some embodiments, a user can login to a website associated with the mobile base station and enter a password associated with the mobile base station into the website to enable the encryption of user device traffic. In other embodiments, a user can download an application associated with the mobile base station onto his or her user device and enter a password associated with the mobile base into the application to enable the encryption of user device traffic.

Mobile base stations 105, 106, 107, 116 can be configured to ensure that a corresponding transmit power does not interfere with the signals of other mobile and/or fixed base stations. When a mobile base station is added to a coverage area of a macro base station, the mobile base stations of the coverage area can be configured to adjust a corresponding transmit power to ensure that corresponding signals do not interfere with the signal of the new mobile base station.

User devices 108, 118 mobile device can connect to a mobile telecommunications network via a macro base station or a mobile base station. User devices 108 can be a smart phone, a cell phone, a tablet, a laptop, a personal digital assistant, a smart watch, an IoT device, an autonomous vehicle, or any other device with cellular connectivity.

Figure 1B:
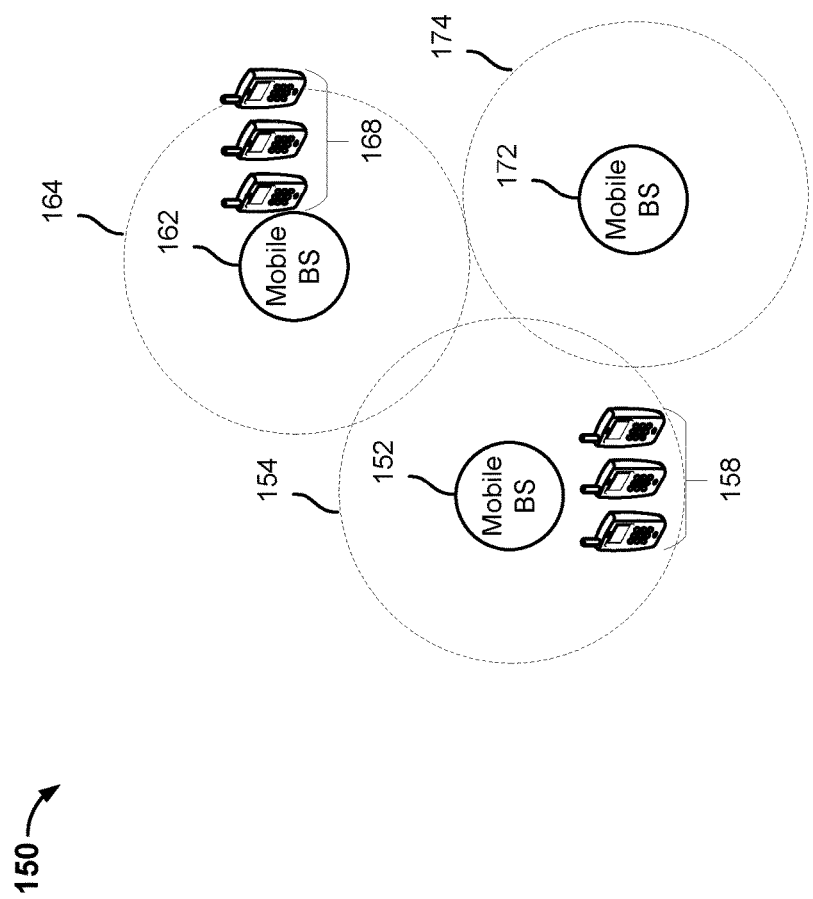
FIG. 1B is a block diagram illustrating an embodiment of a system for providing mobile telecommunications.

FIG. 1B is a block diagram illustrating an embodiment of a system for providing mobile telecommunications. System 150 includes mobile base stations 152, 162, 164 with coverage areas 154, 164, and 174, respectively. The mobile base stations are capable of creating a mobile telecommunications network.

Mobile base station 152 can be configured to provide cell coverage to user devices 158. Mobile base station 152 may be unaware of other nearby mobile base stations. Mobile base station 162 can be configured to provide cell coverage to user devices 168 and may be unaware of other nearby mobile base stations. As mobile base station 152 and 162 move around, coverage areas 154 and 164 may overlap. The orchestrators associated with mobile base stations 152, 162 can negotiate a division of a radio resource and power limits such that each mobile base station can serve their respective user devices without interference.

If the coverage area 174 of mobile base station 172 overlaps with either coverage area 154 or coverage area 164, the orchestrators associated with mobile base stations 152, 162, and 172 can negotiate with each other over the division of radio resource and power. In some embodiments, a user device can receive coverage from any of mobile base stations 152, 162, 172. In that instance, the orchestrators associated with mobile base stations 125, 162, and 172 can negotiate with each other to determine which mobile base station provides coverage to the user device.

Figure 2:
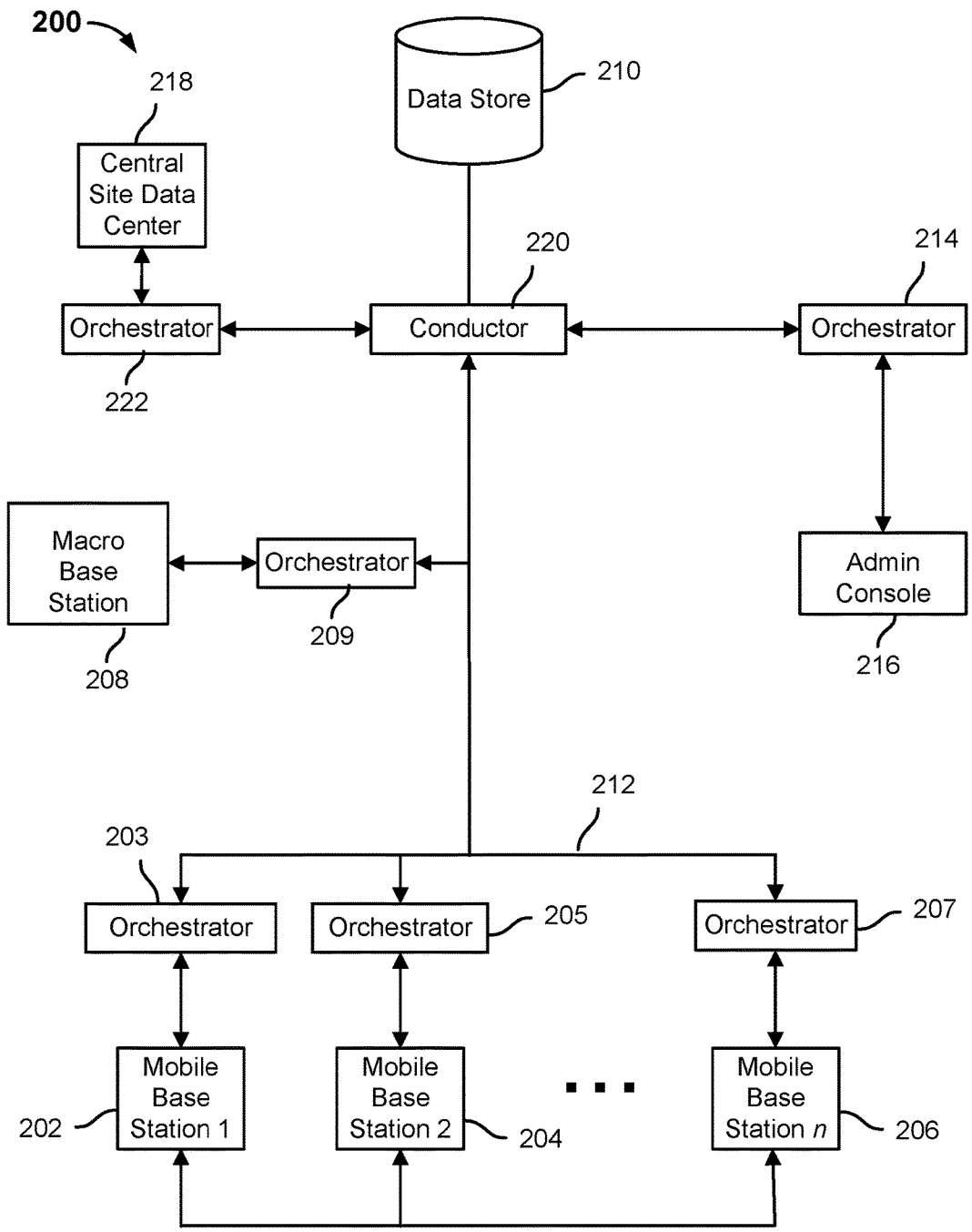
FIG. 2 is a block diagram illustrating an embodiment of a wireless communication system.

FIG. 2 is a block diagram illustrating an embodiment of a wireless communication system. In the example shown, wireless communication system 200 includes mobile base station 202 and associated local disturbed orchestrator 203, mobile base station 204 and associated local distributed orchestrator 205, mobile base station 206 and associated local distributed orchestrator 207, macro base station 208 and an associated local distributed orchestrator 209, conductor 220, data store 210, central site data center 218 and associated local distributed orchestrator 222, an admin consultant 216 and associated local distributed orchestrator 214. Although three mobile base stations are depicted, wireless communication system 200 can include n mobile base stations.

Mobile base stations 202, 204, and 206 are associated with orchestrators 203, 205, and 207 respectively. Macro base station 208 is associated with orchestrator 209. In some embodiments, an orchestrator comprises software running on a processor comprising the base station with which the orchestrator is associated. In some embodiments, the orchestrator is part of a virtual machine or container running on a processor comprising the base station with which the orchestrator is associated. In other embodiments, an orchestrator is part of a computer or server connected to a base station. For example, an orchestrator can be contained in a 'back pack computer" attached to the network component to which it is associated or housed in a server someplace else in the network.

Conductor 220 is connected via communication line 212 to orchestrators 203, 205, 207, 209. In some embodiments, conductor 209 is located within central site data center 218 (i.e., the same data center as the evolved Packet Core (ePC) that the base stations are connected to by backhaul). In other embodiments, conductor 209 is located outside central site data center 218. Orchestrators 203, 205, 207, 209 communicate with each other and conductor 220 via communication path 212 to express and/or fulfill requirements. In some embodiments, each of the orchestrators is configured to perform one or more of the steps of the process of FIG. 6, such as by discovering adjacent or otherwise available macro base stations and/or mobile base stations, establishing a connection or otherwise establishing communication with them, describing and/or discovering capabilities, negotiating a contract to fulfill a requirement, configuring the mobile base station with which it is associated to fulfill a contract, and actually performing operations to fulfill the requirement as agreed in the contract.

In some embodiments, the mobile base stations are coordinated, in the example shown, at least in part by a conductor system 220. Conductor 220 creates the Orchestrators, configures them, and accesses mobile base station image data and global information about the environment which can include technical detail not available to the mobile base station, environmental information (such as sun spot forecasts, impending hurricane, etc.) and impending human activity which will affect demand for services (such as a parade, sporting event, political demonstrations, etc.) stored in a data store 210 to determine for a resource or other requirement a mobile base station to fulfill the requirement.

In various embodiments, each of the mobile base stations 1 through n is represented in data store 210 by corresponding mobile base station image data that indicates one or more of an objective of the mobile base station (e.g., establish and maintain call connectivity as required), rules that apply to the mobile base station, algorithms associated with the mobile base station (e.g., ones the mobile base station is configured to implement and/or algorithms conductor 220 should use to meet needs of the mobile base station and/or determine whether the mobile base station should be used to meet a particular need, or that its associated Orchestrator should use), capabilities of the mobile base station, how the mobile base station is configured and/or capable of being configured, and an environment in which the mobile base station is operating, e.g., currently.

Data store 210 can include image data associated with mobile base stations 202, 204, 206, image data associated with macro base station 208, and image data associated with user devices connected to wireless communication network 200. The image data can indicate one or more of an objective of macro base station(s), mobile base station(s), and/or user device(s); rules that apply to the macro base station(s), mobile base station(s), and/or user device(s); algorithms associated with the macro base station(s), mobile base station(s), and/or user device(s), capabilities of the macro base station(s), mobile base station(s), and/or user device(s), current and potential configurations of the macro base station(s), mobile base station(s), and/or user device(s), and an environment of the macro base station(s), mobile base station(s), and/or user device(s).

In various embodiments, data store 210 is implemented as an IF-MAP or similar data store, in which each mobile base station is represented by a metadata record that expresses attributes of the mobile base station in a meta-language. The IF-MAP data store enables a data schema to be derived from metadata records received to be stored. IF-MAP provides the ability of IF-MAP clients, such as mobile base stations 1 to n, to store and update metadata records, and for orchestrators 203, 205, 207, 209 and/or conductor 220 to subscribe to be updated in the event of changes in mobile base station image data, for example, as a mobile base station is reconfigured, has a capability degraded and/or upgraded, detects a change in its environment, such as a beacon or other signal of a nearby BTS or femtocell, etc. While IF-MAP is used in some embodiments, in other embodiments an IF-MAP like data store is used. Characteristics of such a data store include the ability to can grow and change organically (that is to change internal data model(s) while continuing to operate), and that has the ability to just deliver only the information that is needed, where it is needed, when it is needed. The IF-MAP like data store can subscribe to the appearance or change of a particular data item (object) that is published from its own data store, published from another Orchestrator, and/or published from another Conductor. In some embodiments, orchestrators 203, 205, 207, 209 have a corresponding data store (not shown). The data stores of the conductor and orchestrators, in combination, can provide a view of the situation of the whole communication network.

In various embodiments, conductor 220 is configured to fulfill requirements by searching mobile base station image data in data store 210 to identify one or more mobile base stations capable of fulfilling the requirement. Competing requirements are fulfilled optimally by applying one or more algorithms identified in mobile base station image data as being associated with and/or supported by one or more mobile base stations identified based on mobile base station image data as having a capability that could be used to fulfill the requirement. The conductor 220 in various embodiments is configured to resolve differences between algorithms associated with dissimilar mobile base stations and/or to implement a global optimization algorithm configured to achieve a globally optimal solution, 4 g by finding an optimal combination of locally optimized solutions. Conductor 220 is configured to monitor the behavior of the orchestrators and intervenes when necessary to create global optimization.

In various embodiments, orchestrators 203, 205, 207, 209 are configured to fulfill requirements by searching mobile base station image data in their corresponding data store to identify one or more mobile base stations capable of fulfilling the requirement. Competing requirements are fulfilled optimally by applying one or more algorithms identified in mobile base station image data as being associated with and/or supported by one or more mobile base stations identified based on mobile base station image data as having a capability that could be used to fulfill the requirement. For example, an orchestrator associated with a base station (either fixed or mobile) can detect insufficient capacity and broadcast a message to other orchestrators requesting the mobile base stations to which the other orchestrators are associated, to move to a certain area. In response, the other orchestrators can negotiate between each other, which mobile base station(s) will come to the certain area. In other embodiments, when there is an excess capacity in a certain area or neighborhood, the orchestrators associated with the mobile base stations can negotiate with each other regarding moving capacity to other areas/neighborhoods by moving channels (etc.) and/or moving mobile base stations.

Conductor 220 can exchange resource/power and topology information with orchestrators 203, 205, 207, 209. Orchestrators 203, 205, 207, 209 can also be configured to exchange resource/power and topology information with each other. Resource/power information can include information associated with the division of bandwidth resources (e.g., frequency, time slot, code division space, sub carriers, beam forming, etc.), information associated with transmit power, and/or information associated with antenna directionality (either by physical angling or by electronic beam forming, etc.). Topology information can include the physical distribution/location of a base station. In some embodiments, conductor 220 can negotiate with orchestrators 203, 205, 207, 209 regarding resource/power settings. In other embodiments, orchestrator 209 can negotiate with orchestrators 203, 205, 207 regarding resource/power settings. This ensures that the transmit power of the mobile base stations do not interfere with each other.

Wireless communication system 200 can include an administrator console 216 that is configured to install, configure, and maintain conductor 220. Administrator console 216 is associated with orchestrator 214. Orchestrator 214 is configured to provide specific data visualization, security specific to administrator console 216, and security access control.

Wireless communication system 200 can include a central site data center 218. Central site data center 218 can include a Mobility Management Entity (MME). The MME provides connectivity between base stations and the public internet/telephone network as well as keeping track of where mobile end user equipment (user equipment) is. The MME plays a role in assigning user equipment to particular base stations. In some embodiments, topology information is contained in a network core element such as the MME in an ePC (Mobility Management Entity in an evolved Packet Core as specified in 4G cellular networks or similar). Central site data center 218 can be associated with orchestrator 222. Orchestrator 222 can be configured to update the MME's neighbor list. In other embodiments, a fixed static set of parameters can be assigned in such the MME as well as some or all fixed base stations to support mobile base stations when they arrive. The mobile base stations' orchestrators can discover/negotiate and conform to these predefined sets.

Figure 3A:
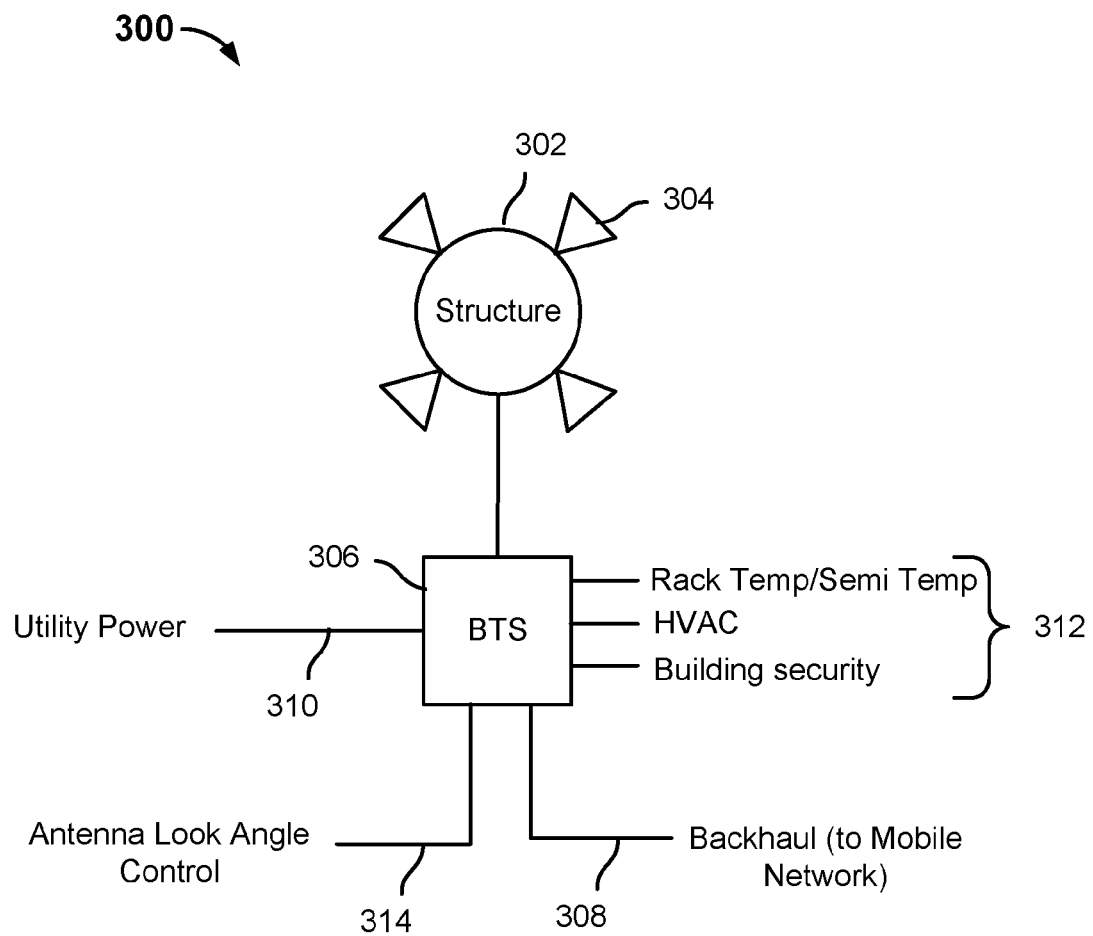
FIG. 3A is a block diagram illustrating an embodiment of a fixed base station.

FIG. 3A is a block diagram illustrating an embodiment of a fixed base station. In some embodiments, fixed base station 300 can be implemented by a macro base station, such as macro base stations 102, 104. In other embodiments, fixed base station 300 can be a fixed small cell. In some embodiments, a fixed small cell can be used in place of a macro base station.

In the example shown, fixed base station 300 comprises a structure 302 on which a physical or logical array of antennae 304 are mounted. Each antenna points in a direction and is oriented at an up or down angle, under control of antenna look angle control signals 314, to provide cell coverage in a coverage area near structure 302. The structure and antennae are associated with a base transceiver station (BTS or other base station) 306, in which equipment to convert signals received via antennae 304 to information signals to be sent to the mobile network infrastructure via a backhaul connection 308, and vice versa, and associated auxiliary equipment are housed. In some embodiments, backhaul connection 308 provides backhaul for one or more mobile base stations. Utility power is supplied via a line 310. HVAC status and environmental (e.g., temperature) parameters, readings from specific sensors on racks, components or individual semiconductors security alarms, and data associated with other conditions are monitored via feedback signal 312, which provided monitoring data to a central operations center for monitoring. Each of these feedback signals are generally carried on their own separate channel to their own separate monitoring console.

Figure 3B:
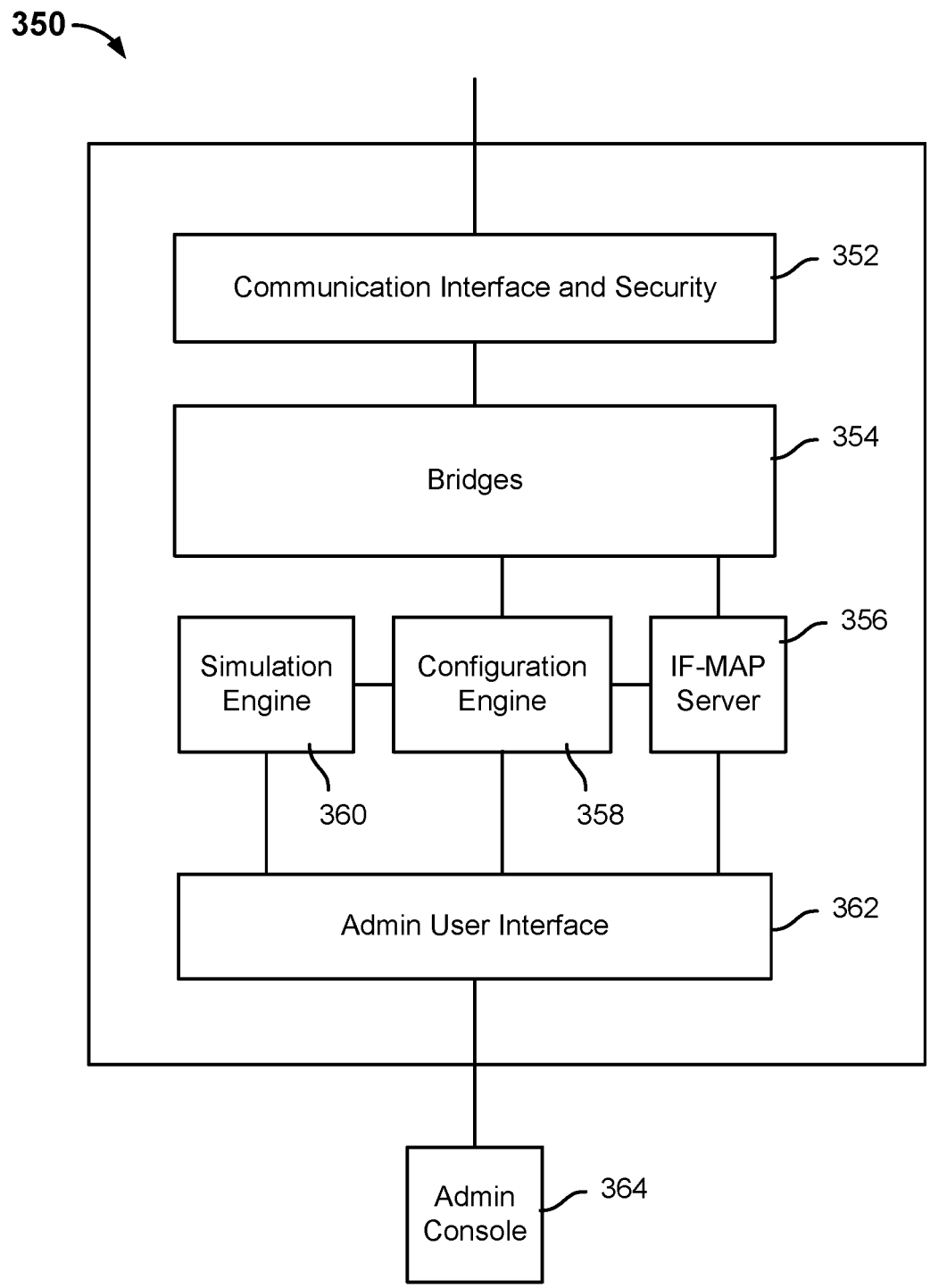
FIG. 3B is a block diagram illustrating an embodiment of a conductor system.

FIG. 3B is a block diagram illustrating an embodiment of a conductor system. In some embodiments, conductor 350 can be implemented as a conductor, such as conductor 220.

In the example shown, conductor 350 includes a communication interface 352 that provides communication with a plurality of other Orchestrators associated with macro base stations, mobile base stations, Network Core Components, other Network Elements, and/or user devices. A set of one or more bridges 354 are configured to translate between base station/device specific communications (protocol(s) and Data Model(s) and a meta-language used by conductor 350 (and Orchestrators) to understand and store the attributes of the respective base stations/devices, receive and process requests from base stations/devices to fulfill requirements, and configure and/or otherwise control and direct Orchestrators associated with base stations/devices to fulfill requirements. Bridges 354 translate communications received from base stations/devices in a base stations/devices-specific format to a representation in the meta-language, and translate commands, queries, etc. expressed in the meta-language to a base stations/devices-specific language, as applicable. Copies of legacy bridges and/or new systems can be stored in conductor 350 and downloaded to an orchestrator. A configuration engine 358, for example one or more software processes executing on a processor, receives and responds to resource requirements, including by identifying and assigning one or more base stations to fulfill a requirement. An IF-MAP server 356 enables Orchestrators associated with a macro base station to store and update their image data. The IF-MAP server 356 also enables Orchestrators associated with other macro base stations/mobile base stations and/or the conductor 350 to subscribe to receive updates to base station image data.

A simulation engine 360 is used to simulate one or more potential solutions to fulfill one or more requirements, for example to validate that a proposed assignment of a mobile base station to fulfill a requirement would work and would not result in other requirements being generated, etc. In various embodiments, the simulation engine is used to perform simulations to answer what if questions such as what will happen to the Network if this particular mobile base station is moved to a location with an increased number of user devices or if this particular mobile base station is activated in a location with an increased number of user devices. The simulator function in the Conductor combines the image data it contains with the new capability, configuration, rules, algorithms and environment data projected for the new mobile base station, event condition, etc. and simulates how the Network would appear from a functional and/or other viewpoint.

An administrative user interface 362 and administrative console 364 provide the ability install a Conductor and to monitor and/or control operation of the conductor 350, for example to execute a system suggested resource allocation and/or configuration, override an automatic resource allocation and/or configuration, and/or otherwise manually provision resources to fulfill requirements and deliver results of simulation and verification testing. In some embodiments, in an initial implementation phase recommendations are delivered to the administrative console and an administrative user can accept or reject the recommendation. Subsequently, in stages greater degrees of automated responsive action are introduced.

Figure 4:
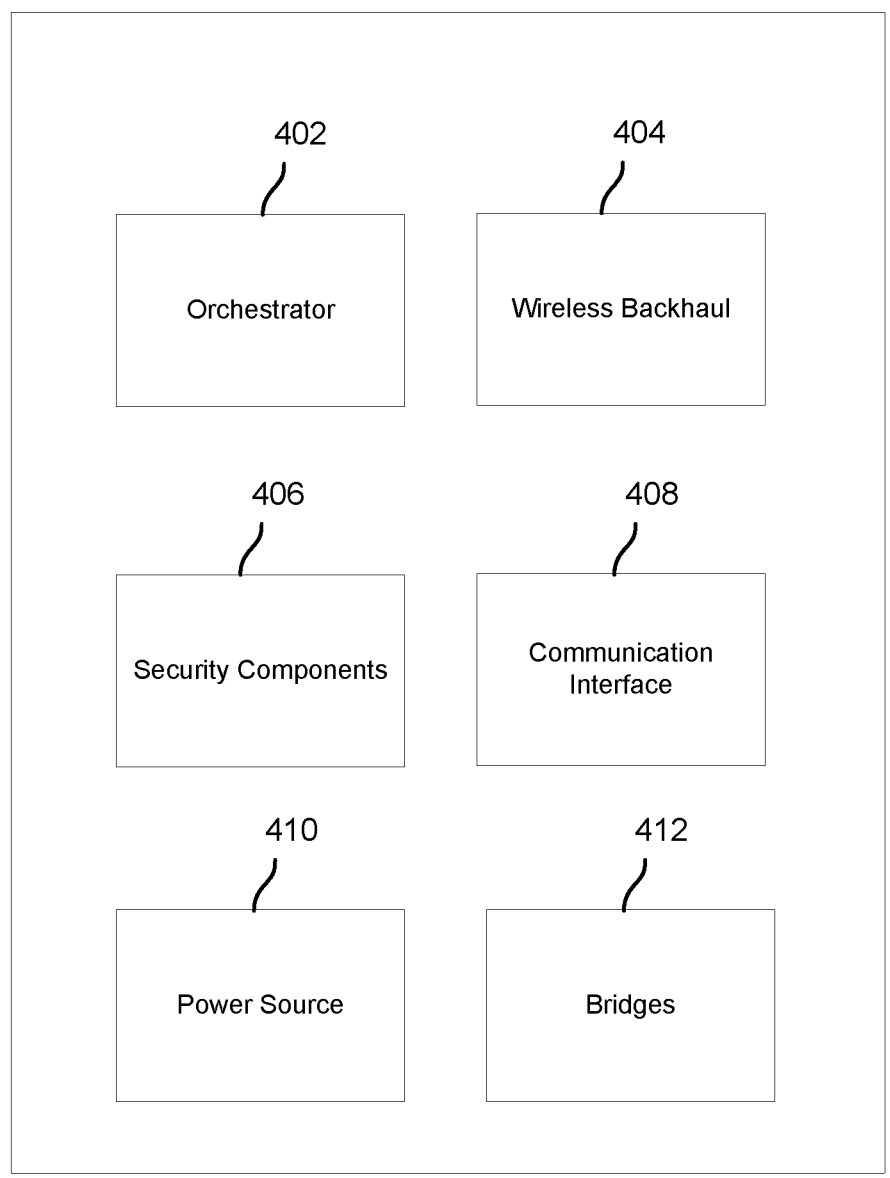
FIG. 4 is a block diagram illustrating an embodiment of a mobile base station.

FIG. 4 is a block diagram illustrating an embodiment of a mobile base station. In some embodiments, mobile base station 400 can be implemented by a mobile base station, such as mobile base stations 105, 106, 107, 116, 152, 162, 172.

Mobile base station 400 can include an orchestrator 402, a wireless backhaul 404, one or more security components 406, a communication interface 408, and/or power source 410.

Orchestrator 402 is configured to communicate with one or more macro base stations, one or more other mobile base stations, and/or one or more user devices via a communication interface to express and/or fulfill requirements. Orchestrator 402 can be configured to discover adjacent or otherwise available macro base stations, mobile base stations, and/or user devices. Orchestrator 402 can be configured to establish a connection with macro base stations and mobile base stations, enabling them to exchange resource/power and topology information and to negotiate resource/power parameters. Orchestrator 402 can configure the mobile base station in which it is located, according to the agreed upon resource/power parameters. Orchestrator 402 can be configured to ensure the mobile base station in which it is located, to perform operations according to the agreed upon resource/power parameters.

In some embodiments, an orchestrator comprises software running on a processor comprising the mobile base station with which the orchestrator is associated. In some embodiments, an orchestrator is implemented as a virtual machine or a container that is hosted on the same hardware that supports the mobile base station. In other embodiments, an orchestrator is contained in a 'back pack computer" attached to the mobile base station, or is housed in a server someplace else in the network.

Wireless backhaul 404 can implement a licensed frequency band or an unlicensed frequency band. For example, a licensed frequency band can be a cellular frequency band or some other licensed frequency band to which the mobile base station has access. Unlicensed frequency band can be a WiFi frequency band, whitespace spectrum, or some other unlicensed spectrum. Wireless backhaul is the use of wireless communication systems to get data from an end user (e.g., a mobile device of a user) to a node in a major network.

Security components 406 can include a security camera, one or more microphones, and/or one or more physical security buttons that when triggered (i.e., panic button), notify personnel at a remote location of a problem occurring within the vehicle in which the mobile base station is installed. In other embodiments, security components 406 can include information security. For example, a mobile base station can have a corresponding encryption key that is used to encrypt the network traffic associated with a user device. In some embodiments, a user can login to a website associated with the mobile base station and enter a password associated with the mobile base station into the website to enable the encryption of user device traffic. In other embodiments, a user can download an application associated with the mobile base station onto his or her user device and enter a password associated with the mobile base into the application to enable the encryption of user device traffic.

Communication interface 408 enables the mobile base station to communicate with one or more other mobile base stations, one or more macro base stations, and/or one or more user devices via an out of band path. Communication interface 412 includes a plurality of antennas and a power source (on a scale that is bigger than a handset) that allows it to transmit at higher power than a typical mobile device (e.g., handset).

Power source 410 can include one or more batteries. In some embodiments, power source 410 includes one or more solar panels to recharge the one or more batteries. In some embodiments, the one or more batteries are separate from a battery used to power a vehicle. In other embodiments, the one or more batteries is the vehicle battery. In some embodiments, power source 410 can provide power to the mobile base station when the vehicle in which the mobile base station is installed, is being charged by an electric power station (i.e., the vehicle is at a charging station). In other embodiments, power source 410 can be a train track (e.g., mobile base station installed in a subway car or train), an overhead wire (e.g., mobile base station installed in a trolley), and/or a roadway (e.g., inductive coupling).

Figure 5:
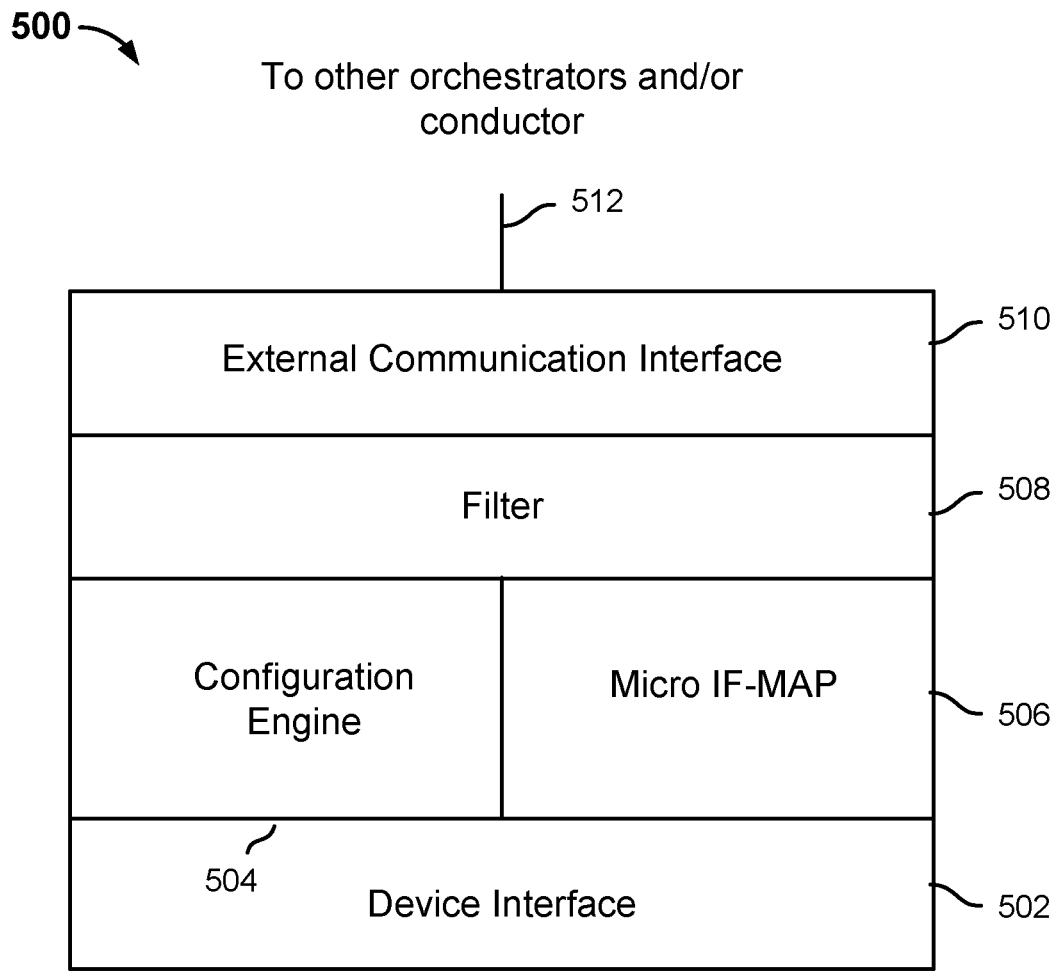
FIG. 5 is a block diagram illustrating an embodiment of an orchestrator.

FIG. 5 is a block diagram illustrating an embodiment of an orchestrator. In some embodiments, orchestrator 500 can be used as an orchestrator, such as orchestrators 203, 205, 207, 402.

Orchestrator 500 includes a device interface 502 (also called a Bridge), a configuration engine 504, a micro IF-MAP data store 506, a filter 508, and an external communication interface 510.

In the example shown, orchestrator 500 includes a device interface 502 used to interface with the device the orchestrator is configured to orchestrate. A local configuration engine 504 interacts with orchestrators at other base stations and/or a central conductor to obtain help from one or more other mobile base stations to accomplish an objective of the mobile base station the orchestration agent is configured to orchestrate. In some embodiments, device interface 502 is configured to download from a conductor legacy bridges and other bridges.

A micro IF-MAP 506 is used to store locally mobile base station image data for the mobile base station on which the orchestrator is stored or with which the orchestrator is associated. In some embodiments, micro IF-MAP 506 is used to store some or all of the image data associated with one or more mobile base stations and/or one or more macro base stations in the physical or virtual vicinity (physically and/or logically) of the mobile base station on which the orchestrator is installed (part of the node's environment). Micro IF-MAP 506 can include a neighbor list of nearby macro base stations and mobile base stations.

A filter layer 508 determines, in some embodiments, which status information to communicate externally and how frequently, to manage how much capacity is consumed by the overhead of configuration control, etc., and to ensure that just the information needed is delivered just where it is needed, just when it is needed. An external communication interface 510 provides connectivity to other macro base stations or mobile base stations via out of band path 512.

In some embodiments, a control point token is used to indicate which mobile base station has the power to control, whether a resource or other requirement will be fulfilled or attempted to be fulfilled initially by communicating directly with other mobile base stations, for example via their respective orchestration agents, or instead will be sent to a central conductor of a macro base station to obtain fulfillment. In this way, the central conductor, if any, only has to intervene to obtain fulfillment of requirements that a mobile base station has been unable to fulfill through local, direct interaction with other mobile base stations. In some embodiments, a filter in each orchestrator decides what and how much meta-information to share with other mobile base stations and/or with the conductor of a macro base station. A control point decides what should be done and sometimes who is to do it. The control point is a "token". It can be passed in whole or in part. So, for example, in a network with no orchestrators and only one conductor, the conductor has the complete token. When some mobile base stations are included in the network, those mobile base stations will be given part of the token. Such as the power to determine cell size through transmit power and look angle with adjacent cells if and only if those cells also have orchestrators, but not with adjacent cells that do not have orchestrators. In a network comprised of a plurality of mobile base stations and a macro base station, the mobile base stations will be given the total local control portion of the token, but the conductor of the macro base station will retain the global portion of the token. In a net of only mobile base stations, the nodes will have the complete control point token. In other implementations, the above will be done solely by negotiation and there will be no use of Tokens. Tokens may also be used to provide assurance that orchestrators and conductors are "alive" and functioning properly.

Figure 6:
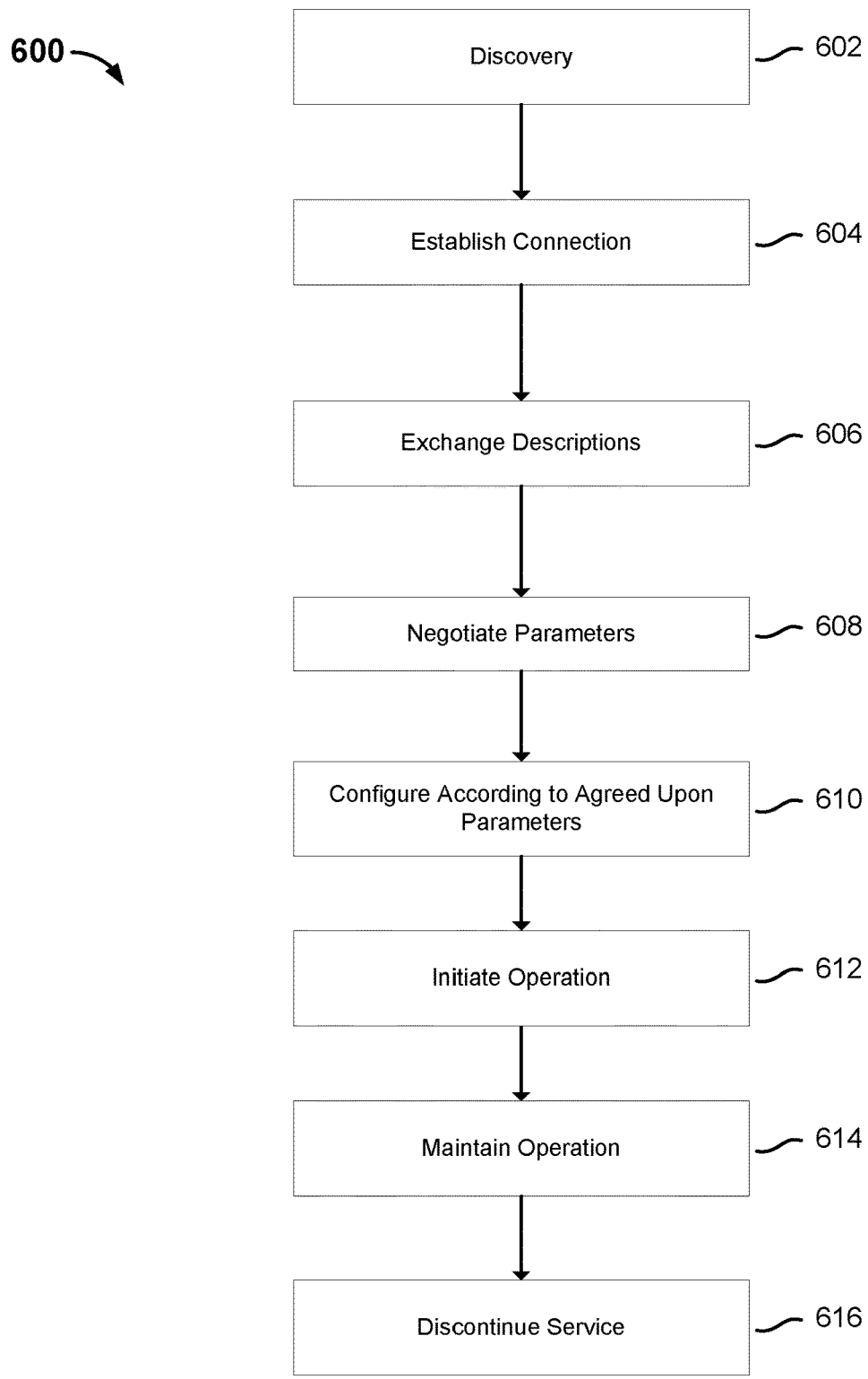
FIG. 6 is a flow chart illustrating an embodiment of a process for adding a mobile base station to a mobile telecommunications network.

FIG. 6 is a flow chart illustrating an embodiment of a process for adding a mobile base station to a mobile telecommunications network. In some embodiments, process 600 can be performed by an orchestrator associated with a mobile base station, such as orchestrators 203, 205, 207. In other embodiments, process 600 can be performed by an orchestrator associated with a macro base station, such as orchestrator 209.

At 602, an orchestrator associated with a mobile base station can discover that it is within a coverage area associated with a macro base station. For example, the orchestrator can detect a signal associated with the macro base station. The orchestrator can be configured to send a request to join the mobile telecommunications network associated with the macro base station.

In other embodiments, an orchestrator associated with a macro base station can discover that a mobile base station is located within its coverage area. For example, the orchestrator can detect a signal associated with the mobile base station. The orchestrator associated with a macro base station can be configured to send a request for the mobile base station to join the mobile telecommunications network.

In other embodiments, an orchestrator associated with a mobile base station discovers that it is within a coverage area associated with another mobile base station. For example, the orchestrator can detect a signal associated with the other mobile base station. The orchestrator can be configured to send a request to join the mobile telecommunications network associated with the other mobile base station. The orchestrator can also be configured to send a request for the other mobile base station to join the mobile base station's telecommunications network.

In other embodiments, the mobile base station or macro base station can send out messages that identify itself and/or one or more of its objectives.

At 604, a connection is established for the purposes of exchanging and negotiating parameters. In some embodiments, a connection is established between an orchestrator associated with a mobile base station and an orchestrator associated with a macro base station. In other embodiments, a connection is established between an orchestrator associated with a mobile base station and an orchestrator associated with another mobile base station.

At 606, descriptions are exchanged. A description can include resource/power information and topology information. Resource/power information can include information associated with the division of bandwidth resources (e.g., frequency, time slot, code division space, sub carriers, antenna angle, beam forming, etc.) and information associated with transmit power. Topology information can include the physical distribution/location of a base station. For example, GPS data associated with a mobile base station can be provided. In some embodiments, a mobile base station and a macro base station exchange descriptions. In other embodiments, a mobile base station and another mobile base station exchange descriptions.

At 608, resource/power parameters are negotiated. For example, resource/power parameters can be negotiated to ensure that the transmit power of a mobile base station does not interfere with other nearby mobile base stations. In some embodiments, an orchestrator of a mobile base station agrees to transmit very low power such that it can only serve user devices in its immediate vicinity. In other embodiments, an orchestrator of a mobile base station uses the information received from a received signal strength indicator to determine the maximum transmitted power.

At 610, the mobile base station and/or macro base station are configured according to the agreed upon parameters. For example, a macro base station can be configured to assign a mobile base station to a specific frequency channel and to communicate with the mobile base station via the specific frequency channel (i.e., backhaul/front haul). The macro base station can also be configured to update its data store with information of the mobile base station. A mobile base station can adjust its communication interface such that it transmits a signal at the agreed upon transmit power.

At 612, operation of the mobile telecommunications network with the addition of a mobile base station is initiated. For example, a mobile base station may be located in a vehicle, such as a bus, with a plurality of user devices in, and in the neighborhood of the bus. The mobile base station can provide the plurality of user devices with cellular coverage.

At 614, operation of the mobile telecommunications network is maintained. In some embodiments, an orchestrator associated with a macro base station can communicate with one or more other orchestrators associated with corresponding mobile base stations included within the coverage area of the macro base station, to adjust a corresponding transmit power to ensure that the transmit power between mobile base stations does not interfere with each other. In some embodiments, the macro base station data store is updated to reflect the adjusted transmit powers. As a mobile base station moves throughout the macro base station's coverage area, the topology information associated with the mobile base station can be updated to reflect a current location of the mobile base station. As the mobile base stations move throughout the macro base station's coverage area, the macro base station can coordinate with the mobile base stations to adjust their corresponding transmit power to ensure that the transmit power between mobile base stations does not interfere with each other.

In other embodiments, an orchestrator associated with a mobile base station can communicate with one or more other orchestrators associated with other mobile base stations included within a mobile base station communication network, and coordinate transmit power to ensure that the transmit power between mobile base stations does not interfere with each other. In other embodiments, the mobile base station data store is updated to reflect the adjusted transmit powers. As the mobile base stations move with respect to each other, the topology information associated with the mobile base stations can be updated to reflect a current location of the mobile base stations. As the mobile base stations move throughout the mobile base station communication network, the orchestrators associated with the mobile base stations can coordinate with each other to adjust their corresponding transmit power to ensure that the transmit power between mobile base stations does not interfere with each other.

At 616, service is discontinued. In some embodiments, a mobile base station may move outside of the coverage area of a first macro base station and to the coverage area of a second macro base station. In that instance, the mobile base station is removed from a neighbor list associated with the first macro base station and added to a neighbor list associated with the second macro base station.

In other embodiments, a mobile base station may move outside the vicinity of other mobile base stations. In that instance, the mobile base station and associated metadata is removed from a neighbor list of the other mobile base stations.

Figure 7:
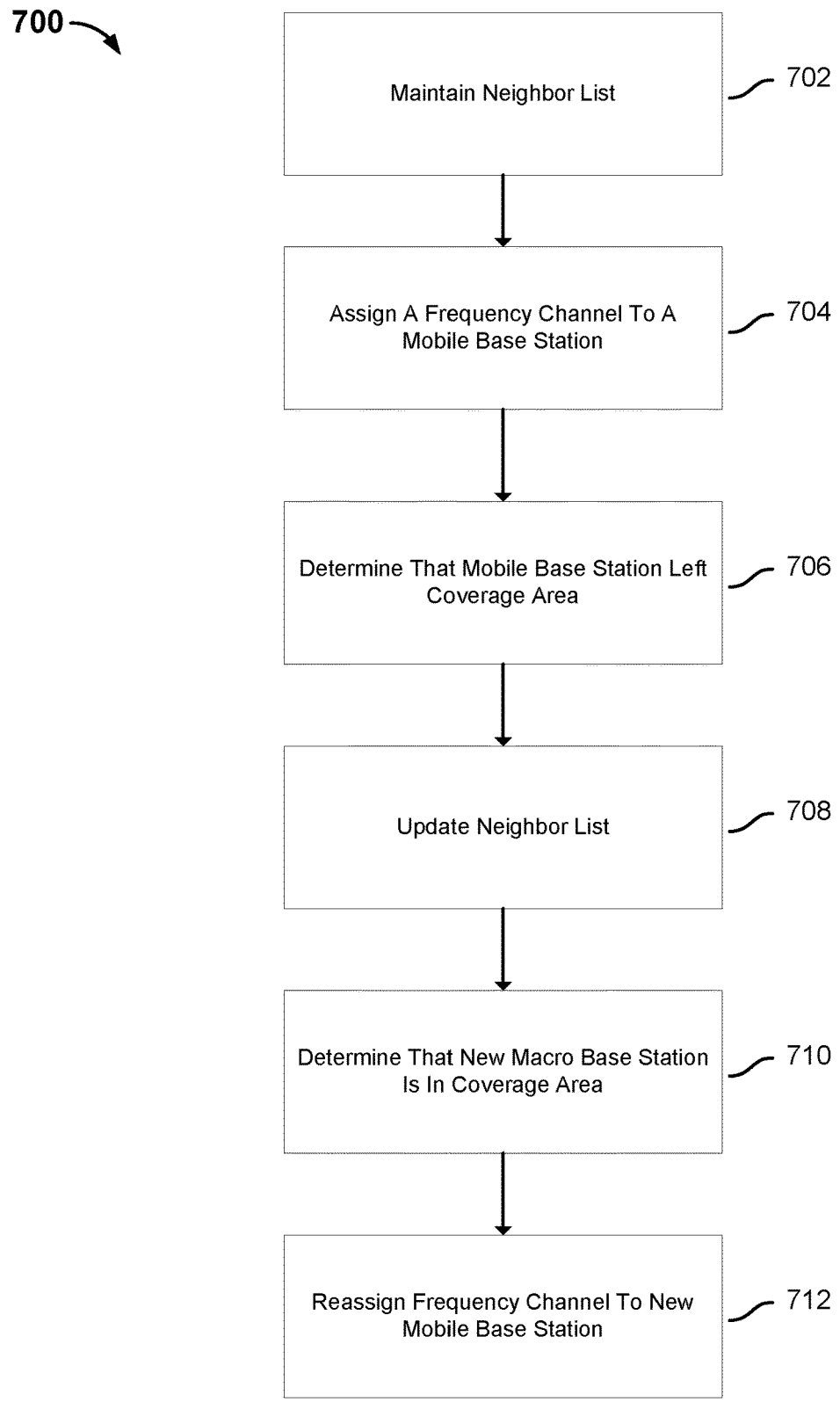
FIG. 7 is a flow chart illustrating an embodiment of a process for adding a mobile base station to a mobile telecommunications network.

FIG. 7 is a flow chart illustrating an embodiment of a process for adding a mobile base station to a mobile telecommunications network. In some embodiments, process 700 can be performed by an orchestrator associated with a macro base station, such as orchestrator 209. In some embodiments, process 700 can be performed by an orchestrator associated with a mobile base station, such as orchestrators 203, 205, 207.

At 702, a neighbor list is maintained. In some embodiments, a macro base station data store includes a list of mobile base stations included within its coverage area. The macro base station data store can include a list of nearby macro base stations. The macro base station data store can include a list of mobile base stations associated with the nearby macro base stations. In other embodiments, a mobile base station data store includes a list of nearby mobile base stations and nearby macro base stations.

At 704, a frequency channel is assigned to a mobile base station. In some embodiments, an orchestrator associated with a macro base station can reserve a plurality of frequency bands for mobile base stations. The orchestrator associated with a macro base station can assign one of the plurality of frequency bands to the mobile base station. In some embodiments, an orchestrator associated with a mobile base station can reserve a plurality of frequency bands for other mobile base stations. The orchestrator associated with a mobile base station can assign one of the plurality of frequency bands to the other mobile base station. In some embodiments, power limits and antenna characteristics can be assigned. In some embodiments, channel assignments of other mobile base stations can be reassigned in order to assign a frequency channel to the mobile base station.

At 706, it is determined that the mobile base station has left the coverage area. In some embodiments, it is determined that the mobile base station has left the coverage area associated with the macro base station. In other embodiments, it is determined that the mobile base station has left the coverage area associated with the mobile base station telecommunications network.

At 708, the neighbor list is updated. The neighbor list can be updated to reflect that the frequency channel assigned to the mobile base station is no longer assigned to the mobile base station and available for reuse.

At 710, it is determined that a new mobile base station has entered the coverage area. The new mobile base station can be configured according to agreed upon parameters. In some embodiments, macro base stations and mobile base stations can undergo some or all of steps of process 602-612 to add the new mobile base station to the mobile telecommunications network. In other embodiments, a first mobile base station and a second mobile base station can undergo some or all of steps of process 602-612 to add the second mobile base station to the mobile telecommunications network.

At 712, the frequency channel previously assigned to the mobile base station is reassigned to the new mobile base station.

Figure 8:
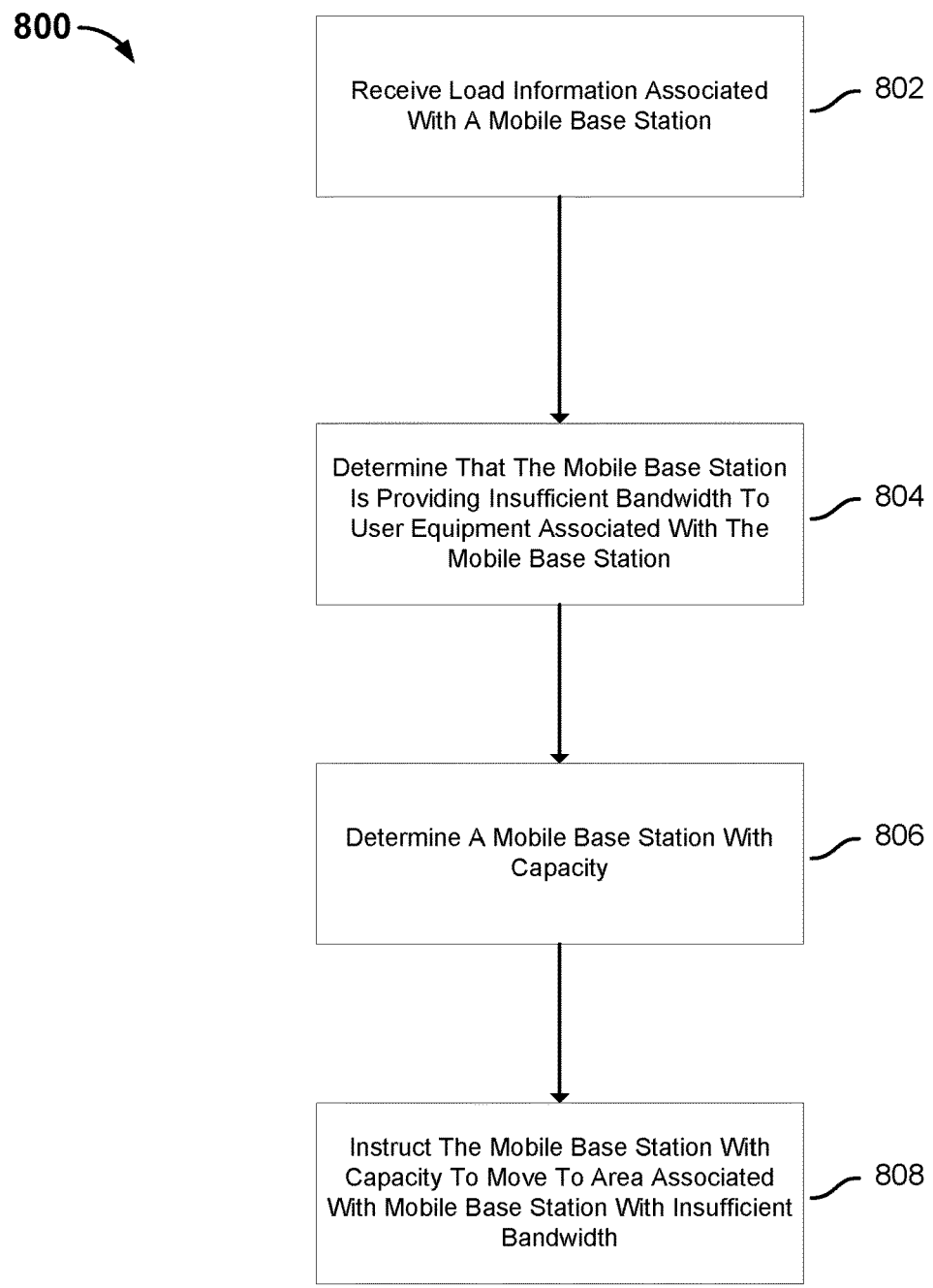
FIG. 8 is a flow chart illustrating an embodiment of a process for increasing capacity of a mobile telecommunications network.

FIG. 8 is a flow chart illustrating an embodiment of a process for increasing capacity of a mobile telecommunications network. In some embodiments, process 800 can be performed by an orchestrator associated with a macro base station, such as orchestrator 209. In other embodiments, process 800 can be performed by an orchestrator associated with a mobile base station, such as orchestrators 203, 205, 207.

At 802, load information associated with a mobile base station is received. A mobile base station can provide one or more user devices with cell coverage. For example, a mobile base station installed in a bus can provide cell coverage to passengers with user devices. In some embodiments, the mobile base station can provide to a macro base station load information associated with the one or more user devices. In other embodiments, the mobile base station can provide to another mobile base station load information associated with the one or more user devices.

At 804, it is determined that the mobile base station is providing insufficient bandwidth to user equipment associated with the mobile base station. In some instances, there may be more user devices requesting cell coverage than a mobile base station is capable of providing, or getting too close to that condition.

At 806, a mobile base station with capacity is determined. For example, a mobile base station can have capacity to provide additional bandwidth to one or more additional user devices. In some embodiments, the determined mobile base station has the highest available capacity of the mobile base stations within a coverage area. In other embodiments, the determined mobile base station has sufficient capacity to meet the bandwidth demands of the user devices associated with the mobile base station that is providing insufficient bandwidth.

In some embodiments, the mobile base station with capacity is located within the coverage area associated with the macro base station. The data store of a macro base station includes topology information associated with one or more other mobile base stations. For example, the topology information stored in an IF-MAP data store associated with a macro base station can be updated whenever topology information (e.g., location) associated with mobile base stations located within the coverage area of the macro base station, changes. Topology information can include GPS data associated with a mobile base station, or sensing information from other base stations relayed by their orchestrators, etc. The data store of the macro base station also includes a neighbor list that lists mobile base stations currently located within the coverage area associated with the macro base station. At least one of the mobile base stations currently located within the coverage area associated with the macro base station can be selected. In some embodiments, the selected mobile base station has the highest available capacity of the mobile base stations within a coverage area. In other embodiments, the selected mobile base station has sufficient capacity to meet the bandwidth demands of the user devices associated with the mobile base station that is providing insufficient bandwidth.

In other embodiments, the mobile base station with capacity is another mobile base station located within the mobile telecommunications network comprised of a plurality of mobile base stations. The data store of a mobile base station includes topology information associated with one or more other mobile base stations. For example, the topology information stored in an IF-MAP data store associated with a mobile base station can be updated whenever topology information (e.g., location) associated with mobile base stations located in the mobile telecommunications network changes. Topology information can include GPS data associated with a mobile base station. The data store of the mobile base station also includes a neighbor list that lists mobile base stations currently located within a vicinity of the mobile base station. At least one of the mobile base stations currently located within the coverage area associated with the mobile base station can be selected. In some embodiments, the selected mobile base station has the highest available capacity of the mobile base stations within a coverage area. In other embodiments, the selected mobile base station has sufficient capacity to meet the bandwidth demands of the user devices associated with the mobile base station that is providing insufficient bandwidth.

At 808, the mobile base station with capacity is instructed to move to an area associated with mobile base station with insufficient bandwidth. In some embodiments, a mobile base station with insufficient bandwidth is associated with a defined route (e.g., bus route). The mobile base station with capacity can be instructed to move to a current location of the mobile base station with insufficient bandwidth or an anticipated location of the mobile base station with insufficient bandwidth.

Figure 9:
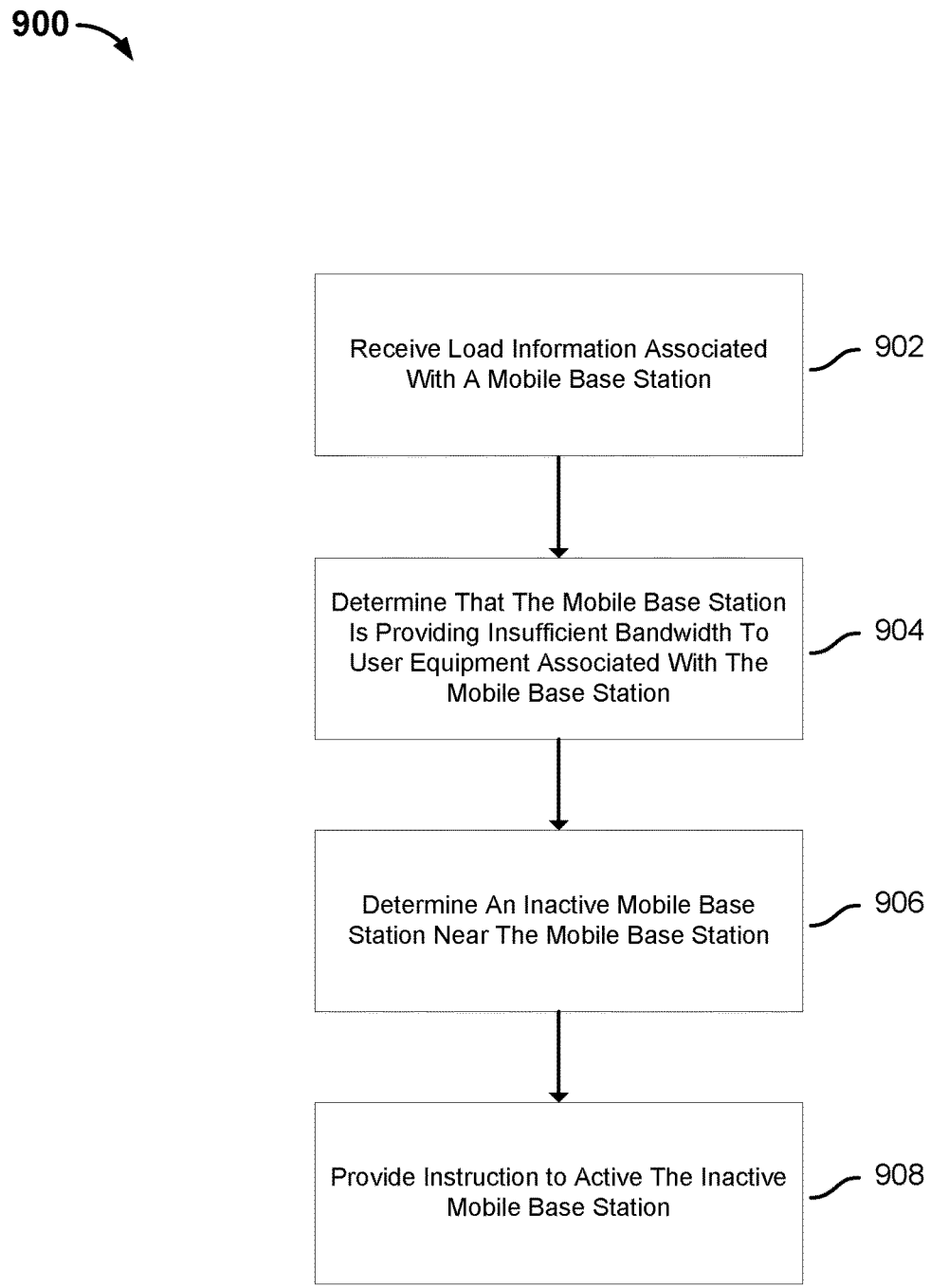
FIG. 9 is a flow chart illustrating an embodiment of a process for increasing capacity of a mobile telecommunications network.

FIG. 9 is a flow chart illustrating an embodiment of a process for increasing capacity of a mobile telecommunications network. In some embodiments, process 900 can be performed by an orchestrator associated with a macro base station, such as orchestrator 209. In other embodiments, process 900 can be performed by an orchestrator associated with a mobile base station, such as orchestrators 203, 205, 207.

At 902, load information associated with a mobile base station is received. A mobile base station can provide one or more user devices with cell coverage. For example, a mobile base station installed in a bus can provide cell coverage to passengers with user devices. In some embodiments, the mobile base station can provide to a macro base station load information associated with the one or more user devices. In other embodiments, the mobile base station can provide to another mobile base station load information associated with the one or more user devices.

At 904, it is determined that the mobile base station is providing insufficient bandwidth to user devices associated with the mobile base station. In some instances, there may be more user devices requesting cell coverage than a mobile base station is capable of providing.

At 906, an inactive mobile base station near the mobile base station is determined. In some embodiments, the data store of a macro base station includes topology information associated with one or more other mobile base stations. For example, the topology information stored in an IF-MAP data store associated with a macro base station can be updated whenever topology information (e.g., location) associated with mobile base stations located within the coverage area of the macro base station, changes. In some embodiments, topology information is contained in a network core element such as the MME in an ePC (Mobility Management Entity in an evolved Packet Core as specified in 4G cellular networks or similar). In such cases, one embodiment can have an orchestrator associated with the MME that would update the MME's neighbor list. In other embodiments, a fixed static set of parameters can be assigned in such a Core component as well as some or all fixed base stations to support mobile base stations when they arrive. The mobile base stations' orchestrators can discover/negotiate and conform to these predefined sets. Topology information can include GPS data associated with a mobile base station. The data store of the macro base station also includes a neighbor list that lists mobile base stations currently located within the coverage area associated with the macro base station. The data store of the macro base station also includes information regarding whether a mobile base station is active (i.e., providing cell coverage to one or more user devices). At least one of the inactive mobile base stations currently located within the coverage area associated with the macro base station can be selected. In some embodiments, an inactive mobile base station is selected based on a proximity of the inactive mobile base station to the mobile base station with insufficient bandwidth. For example, an inactive mobile base station that is located within a distance threshold to the mobile base station with insufficient bandwidth is selected over an inactive mobile base station that is not located within a distance threshold to the mobile base station with insufficient bandwidth.

In some embodiments, the data store of a mobile base station includes topology information associated with one or more other mobile base stations. For example, the topology information stored in an IF-MAP data store associated with a mobile base station can be updated whenever topology information (e.g., location) associated with mobile base stations located within the mobile communications network changes. Topology information can include GPS data associated with a mobile base station. The data store of the mobile base station also includes a neighbor list that lists nearby mobile base stations. The data store of the mobile base station also includes information regarding whether a mobile base station is active (i.e., providing cell coverage to one or more user devices). At least one of the nearby inactive mobile base stations can be selected. In some embodiments, an inactive mobile base station is selected based on a proximity of the inactive mobile base station to the mobile base station with insufficient bandwidth. For example, an inactive mobile base station that is located within a distance threshold to the mobile base station with insufficient bandwidth is selected over an inactive mobile base station that is not located within a distance threshold to the mobile base station with insufficient bandwidth.

At 908, an instruction is provided to activate the inactive mobile base station. The inactive mobile base station becomes active and provides cellular coverage to one or more nearby user devices.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a processor configured to:
exchange mobile base station information with an orchestrator associated with an other base station, wherein image data associated with the other base station is stored in a data store associated with the orchestrator;
negotiate one or more parameters with the orchestrator associated with the other base station based on the mobile base station information;
configure a mobile base station based at least in part on the negotiated one or more parameters;
use the configured mobile base station to provide cellular coverage to one or more user devices;
subscribe to one or more changes to the image data associated with the other base station; and
maintain the provided cellular coverage based on the one or more changes to the image data associated with the other base station; and
a data store coupled to the processor and configured to store the mobile base station information.

2. The system of claim 1, wherein the other base station is a second mobile base station.

3. The system of claim 1, wherein the other base station is a macro base station.

4. The system of claim 1, wherein the mobile base station information includes resource information and power information.

5. The system of claim 4, wherein the resource information includes at least one of frequency, time slot, code division space, sub carriers, and/or beam pattern.

6. The system of claim 1, wherein the mobile base station information includes topology information.

7. The system of claim 1, wherein the processor is further configured to detect a signal associated with the other base station.

8. The system of claim 1, further comprising one or more security components.

9. The system of claim 8, wherein the one or more security components includes a button coupled to a system remote from the mobile base station.

10. The system of claim 1, wherein the processor is further configured to use a wireless backhaul to transmit data to a node in a network.

11. The system of claim 10, wherein the wireless backhaul uses licensed frequency spectrum.

12. The system of claim 10, wherein the wireless backhaul uses unlicensed frequency spectrum.

13. The system of claim 1, wherein the other base station is configured to assign a frequency channel for the mobile base station to provide the cellular coverage to one or more user devices.

14. The system of claim 1, wherein the processor is further configured to provide the other base station with load information associated with the one or more user devices.

15. The system of claim 1, wherein the other base station is configured to instruct and/or negotiate with a second mobile base station to provide cellular coverage in an area associated with the system.

16. The system of claim 1, wherein the other base station is a macro base station that provides backhaul.

17. A method of, comprising:
exchanging mobile base station information with an orchestrator associated with an other base station, wherein image data associated with the other base station is stored in a data store associated with the orchestrator;
negotiating one or more parameters with the orchestrator associated with the other base station based on the mobile base station information;
configuring a mobile base station based at least in part on the negotiated one or more parameters;
using the configured mobile base station to provide cellular coverage to one or more user devices;
subscribing to one or more changes to the image data associated with the other base station; and
maintaining the provided cellular coverage based on the one or more changes to the image data associated with the other base station.

18. The method of claim 17, wherein the mobile base station information includes resource information and power information.

19. The method of claim 17, wherein the other base station is configured to assign a frequency channel for the mobile base station to provide the cellular coverage to one or more user devices.

20. A computer program product for providing cellular coverage, the computer program product being embodied in a non-transitory computer readable storage medium and comprising computer instructions for:
exchanging mobile base station information with an orchestrator associated with an other base station, wherein image data associated with the other base station is stored in a data store associated with the orchestrator associated with the other base station;
negotiating one or more parameters with the orchestrator associated with the other base station based on the mobile base station information;
configuring a mobile base station based at least in part on the negotiated one or more parameters;
using the configured mobile base station to provide cellular coverage to one or more user devices;
subscribing to one or more changes to the image data associated with the other base station; and
maintaining the provided cellular coverage based on the one or more changes to the image data associated with the other base station.

* * * * *

UNITED STATES PATENT AND TRADEMARK OFFICE
CERTIFICATE OF CORRECTION

PATENT NO.        : 10,285,094 B2
APPLICATION NO.   : 15/492541
DATED             : May 7, 2019
INVENTOR(S)       : Mark Cummings It is certified that error appears in the above-identified patent and that said Letters Patent is hereby corrected as shown below:

In the Specification

In Column 7, Lines 9-10, delete "'back pack computer'"" and insert --"back pack computer"--, therefor.

In Column 11, Line 41, delete "'back pack computer'"" and insert --"back pack computer"--, therefor.

Signed and Sealed this
Tenth Day of December, 2019

Andrei Iancu
*Director of the United States Patent and Trademark Office*